(12) United States Patent
Siprak

(10) Patent No.: US 8,372,736 B2
(45) Date of Patent: Feb. 12, 2013

(54) METHOD AND APPARATUS FOR REDUCING FLICKER NOISE IN A SEMICONDUCTOR DEVICE

(75) Inventor: Domagoj Siprak, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/097,120

(22) Filed: Apr. 29, 2011

(65) Prior Publication Data

US 2011/0201186 A1 Aug. 18, 2011

Related U.S. Application Data

(62) Division of application No. 11/619,255, filed on Jan. 3, 2007, now abandoned.

(60) Provisional application No. 60/813,630, filed on Aug. 30, 2006.

(51) Int. Cl.
*H01L 21/425* (2006.01)

(52) U.S. Cl. .................. 438/514; 438/510; 438/511

(58) Field of Classification Search .................. 438/510, 438/511, 514
See application file for complete search history.

(56) References Cited

U.S. PATENT DOCUMENTS

| | | | | |
|---|---|---|---|---|
| 5,322,810 | A * | 6/1994 | Ayukawa et al. | 438/303 |
| 5,620,906 | A | 4/1997 | Yamaguchi et al. | |
| 5,838,048 | A | 11/1998 | Hirai et al. | |
| 6,207,586 | B1 * | 3/2001 | Ma et al. | 438/763 |
| 6,525,403 | B2 | 2/2003 | Inaba et al. | |
| 6,573,197 | B2 | 6/2003 | Callegari et al. | |
| 6,642,090 | B1 | 11/2003 | Fried et al. | |
| 6,797,555 | B1 | 9/2004 | Hopper et al. | |
| 6,885,055 | B2 | 4/2005 | Lee | |
| 6,888,204 | B1 | 5/2005 | Lyding et al. | |
| 6,908,820 | B2 | 6/2005 | Koyama | |
| 6,974,983 | B1 | 12/2005 | Hill et al. | |
| 7,018,880 | B2 | 3/2006 | Hao et al. | |
| 7,915,167 | B2 * | 3/2011 | Radosavljevic et al. | 438/689 |
| 2002/0109177 | A1 | 8/2002 | D'Souza et al. | |
| 2004/0075122 | A1 | 4/2004 | Lin et al. | |
| 2004/0207010 | A1 | 10/2004 | Furuhata | |
| 2005/0087812 | A1 | 4/2005 | Trogolo et al. | |
| 2005/0098822 | A1 | 5/2005 | Mathew et al. | |
| 2005/0104096 | A1 | 5/2005 | Lee et al. | |
| 2005/0136579 | A1 | 6/2005 | Hao | |
| 2005/0148134 | A1 | 7/2005 | Dokumaci et al. | |
| 2005/0167764 | A1 | 8/2005 | Li | |
| 2005/0186742 | A1 | 8/2005 | Oh et al. | |
| 2005/0255684 | A1 | 11/2005 | Koldiaev et al. | |
| 2006/0057787 | A1 * | 3/2006 | Doris et al. | 438/153 |
| 2006/0068591 | A1 * | 3/2006 | Radosavljevic et al. | 438/689 |
| 2008/0054361 | A1 | 3/2008 | Siprak | |
| 2008/0242066 | A1 * | 10/2008 | Jacobson et al. | 438/525 |

OTHER PUBLICATIONS

"U.S. Appl. No. 11/619,255, Non Final Office Action mailed Nov. 29, 2010", 22 pgs.
"U.S. Appl. No. 11/619,255, Non-Final Office Action mailed Aug. 21, 2008", 11 pgs.
"U.S. Appl. No. 11/619,255, Final Office Action mailed Apr. 3, 2009", 18 pgs.
"U.S. Appl. No. 11/619,255, Final Office Action mailed May 20, 2010", 19 pages.
"U.S. Appl. No. 11/619,255, Non Final Office Action mailed Oct. 8, 2009", 18 pgs.
"U.S. Appl. No. 11/619,255, Response filed Jul. 15, 2009 to Final Office Action mailed Apr. 3, 2009", 15 pgs.

(Continued)

*Primary Examiner* — Bradley K Smith
(74) *Attorney, Agent, or Firm* — Schwegman, Lundberg & Woessner, P.A.

(57) ABSTRACT

Some embodiments discussed relate to an integrated circuit and methods for making it. In an example, a method can include providing a semiconductor wafer including a fin, and introducing a noise-reducing dopant into a sidewall of the fin.

28 Claims, 5 Drawing Sheets

OTHER PUBLICATIONS

"U.S. Appl. No. 11/619,255, Response filed Nov. 8, 2010 to Advisory Action mailed Sep. 7, 2010", 16 pgs.

"U.S. Appl. No. 11/619,255, Response filed Dec. 22, 2008 to Non Final Office Action mailed Aug. 21, 2008", 11 pgs.

"U.S. Appl. No. 11/619,255, Response filed Feb. 8, 2010 to Non Final Office Action mailed Oct. 8 2009", 19 pgs.

"U.S. Appl. No. 11/619,255, Response filed Jul. 19, 2010 to Final Office Action mailed May 20, 2010", 14 pgs.

"German Application Serial No. 102007041082.6, Office Action mailed Feb. 3, 2009", 14 pgs.

"Silicon Processing for the VLSI Era vol. 1, 2nd edition, S.Wolf and R.N. Tauber", Silicon Processing for the VLSI Era vol. 1, 2nd edition, S.Wolf and R.N. Tauber, (2000), 325.

Lai, P. T, et al., "Improvement on 1/f noise properties of nitrided n-MOSFETs by backsurface argon bombardment", IEEE Electron Device Letters, 20(4), (Apr. 1999), 149-151.

* cited by examiner

METHOD AND APPARATUS FOR REDUCING FLICKER NOISE IN A SEMICONDUCTOR DEVICE

RELATED APPLICATIONS AND CLAIM OF PRIORITY

This application is a divisional of and claims the benefit of priority under 35 U.S.C. §120 to Siprak, U.S. patent application Ser. No. 11/619,255, entitled "METHOD AND APPARATUS FOR REDUCING FLICKER NOISE IN A SEMICONDUCTOR DEVICE," filed on Jan. 3, 2007, which claims the benefit of priority under 35 U.S.C. §119(e) of Siprak, U.S. Provisional Patent Application Ser. No. 60/813,630, entitled "METHOD AND APPARATUS FOR REDUCING FLICKER NOISE IN A SEMICONDUCTOR DEVICE," filed on Aug. 30, 2006, the benefit of priority of each of which is claimed hereby, and each of which are incorporated by reference herein in its entirety.

TECHNICAL FIELD

Embodiments described herein relate generally to semiconductor devices and more particularly, to field-effect transistors (FETs) and methods of fabricating the same.

BACKGROUND

Flicker noise is a dominant noise source in metal oxide semiconductor field-effect transistor (MOSFET) devices at low frequencies. In battery-driven circuits where signal-to-noise ratio cannot be improved at the cost of power consumption, a reduction of flicker noise is desired.

DETAILED DESCRIPTION

Figure 1A:
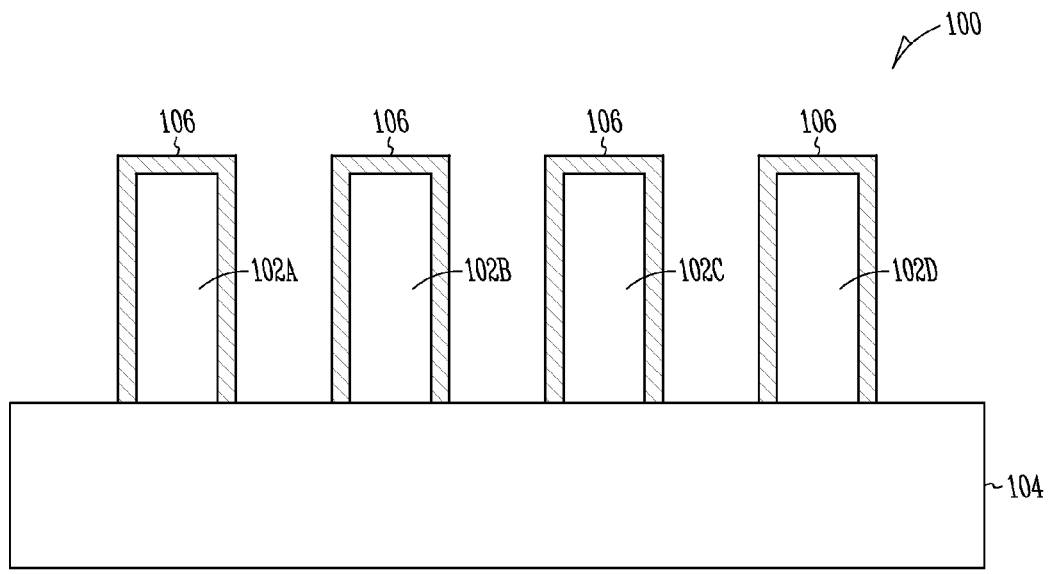
FIG. 1A-1E illustrate a sequence of cross-sectional drawings of a partially completed semiconductor wafer showing some embodiments of a method of fabrication of a semiconductor device having a dopant implanted into silicon fins.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

In the following description, the terms "wafer" and "substrate" may be used interchangeably to refer generally to any structure on which integrated circuits are formed and also to such structures during various stages of integrated circuit fabrication. The term "substrate" is understood to include a semiconductor wafer. The term "substrate" is also used to refer to semiconductor structures during processing and may include other layers that have been fabricated thereupon. Both "wafer" and "substrate" include doped and undoped semiconductors, epitaxial semiconductor layers supported by a base semiconductor or insulator, as well as other semiconductor structures well known to one skilled in the art.

The term "conductor" is understood to generally include n-type and p-type semiconductors and the term "insulator" or "dielectric" is defined to include any material that is less electrically conductive than the materials referred to as "conductors." The following detailed description is, therefore, not to be taken in a limiting sense.

FIGS. 1A-1E illustrate a sequence of cross-sectional drawings of a partially completed semiconductor wafer 100 of some embodiments of a method of fabrication showing a dopant implanted into vertical silicon fins 102A, 102B, 102C, and 102D. Vertically positioned silicon fins 102A-D are disposed and positioned vertically on a substrate 104. The shape, height "h", width "w" of each of the silicon fins 102A-D and the spacing "s" between two consequent fins are dependant upon the characteristics of the device being fabricated.

In some embodiments, height "h" of the silicon fins 102A-D falls within a range and is given by equation $Lg_{min}/2 \leq h \leq 1$ µm, where, $Lg_{min}$ is the minimum gate length according to the technology used in a particular case. The rationale for this is that the height "h" determines the power consumption of single fin digital circuits such as logical gates or static random access memory (SRAMs). Given that, in some embodiments, typical minimum gate lengths used are in the range of 45 nm to 65 nm, and hence, height "h" in some embodiments can be as small as 20 nm. The upper limit of height "h" is determined by the mechanical stability of the fins. Typically, the higher the fin the smaller the device area.

In some embodiments, the spacing "s" between the silicon fins 102A-D falls within a range and is given by equation $h/2 \leq s \leq 3$ µm. Spacing "s" can be made larger, however, may be constrained by factors such as available device area, gate resistance, and parasitic gate capacitance.

In some embodiments, the thickness (or width) "w" of the silicon fins 102A-D can be chosen according to the desired device characteristics. When a width "w"$\leq$30 nm is used, a fully depleted device is provided with good sub-threshold characteristics and without floating-body effect. In some embodiments, where a larger thickness is used for silicon fins 102A-D, it leads to a partially depleted device with reduced source and drain resistance and reduced flicker noise which is important for the performance of radio-frequency (RF) circuits.

In some embodiments, a reduction in the flicker noise is achieved when a larger thickness "w" is used. This is as a result of having the presence of different flicker noises corresponding to different surface features. Different flicker noise on different surface orientation is a result of different matching between silicon lattice of the fin and the gate insulator material at the surface. Surface direction is defined by the miller indices (e.g. (100)). In some embodiments, surfaces having surface directions (100), (010) and (001) show lowest flicker noise. In some embodiments, as a result of the use of plasma nitrided gate oxides, other surface directions also have been found to have low flicker noise. In general, for a certain process a particular surface direction has the lowest flicker noise for a certain carrier type (holes or electrons). For example, in MuGFETs, the surface at the top of the fin can be different from the sidewalls. A MuGFET with a (100) top surface by drawing the fin with a 45° angle to the (010) surface can get a (011) surface for the sidewall conducting channels. Such different surface orientations are chosen to enhance mobility. A trade-off between mobility and flicker noise together with source and drain resistance is performed by choosing different contributions of top and sidewall surfaces. This can be achieved by increasing the thickness "w" of the fin. Thus, the signal can be increased by reducing the source-drain resistance and flicker noise is reduced by increasing the thickness of the fin. Consequently, the signal-to-noise ratio is increased due to the increase in signal and reduction in the flicker noise.

Another effect that influences flicker noise is surface roughness. In general, the flicker noise is dependent on the different surface features such as surface roughness and surface orientation. In some embodiments, side-walls 105 of silicon fins 102A-D are usually of rougher surface than the surface of top 107 of silicon fins 102A-D. This is as a result of fin etching that is described later in this specification.

The smooth surface, having a lattice arrangement (100) of top 107, has lower flicker noise than a rough surface, characterized by a lattice orientation of (010) or (011), of side-walls 105. Consequently, by choosing a larger thickness "w", the amount of low flicker noise contributed by smooth surface (100) of 107 can be relatively increased in comparison to the high flicker noise contribution from sidewalls 105.

In some embodiments having fully depleted devices, the thickness "w" is within the range of about 5 nm and about 30 nm. In some embodiments, the lower limit of about 5 nm for thickness "w" is essential to enable fluorine to be implanted in silicon fins 102A-D. In general, a thickness "w" smaller than 5 nm is not preferable due to the increased drain and source resistance. In some embodiments, devices with a reduced drain and source resistance, a reduced flicker noise thickness "w" can range from about 30 nm to about 3 μm. Hence, by increasing the thickness "w" of the fin one can combine the advantage of lower flicker noise together with lower drain and source resistance which is advantageous for devices used in RF circuits. In some embodiments, the reduced contribution to the total current in the sidewalls in this case can be compensated by using a surface orientation with higher mobility for the sidewalls. In some embodiments, use of thickness "w" larger than 3 μm can lead to increased gate resistance and a parallel finger structure may be used to realize larger gate widths for finFET devices.

In the embodiments shown in FIGS. 1A-1E and FIG. 2, silicon fins 102A-D are approximately rectangular in shape. In some embodiments, strictly rectangular shaped silicon fins 102A-D are avoided. Some other embodiments use rectangular-shaped silicon fins with the edges rounded that provides better electrical device performance.

In some embodiments, substrate 104 is a buried oxide layer. In other embodiments, substrate 104 is a bulk silicon layer.

FIG. 1A is a cross-sectional view through a partially completed semiconductor wafer 100 having silicon fins 102A-D being oxidized to form a screening oxide layer 106 on each of the silicon fins 102A-D. In some embodiments, screening oxide layer 106 includes silicon dioxide. Screening oxide layer 106 is grown over the silicon surface prior to a dopant implant process performed according to that shown in FIG. 1B. Screening oxide layer 106 provides protection against unintended knock-on metallic contaminants (such as iron (Fe) and Nickel (Ni)) received from the ion implanter. In some embodiments, the thickness of the screening oxide layer can range from about 1 nm to about 15 nm. In some embodiments, the thickness of screening oxide would be around 3 nm.

Figure 1B:
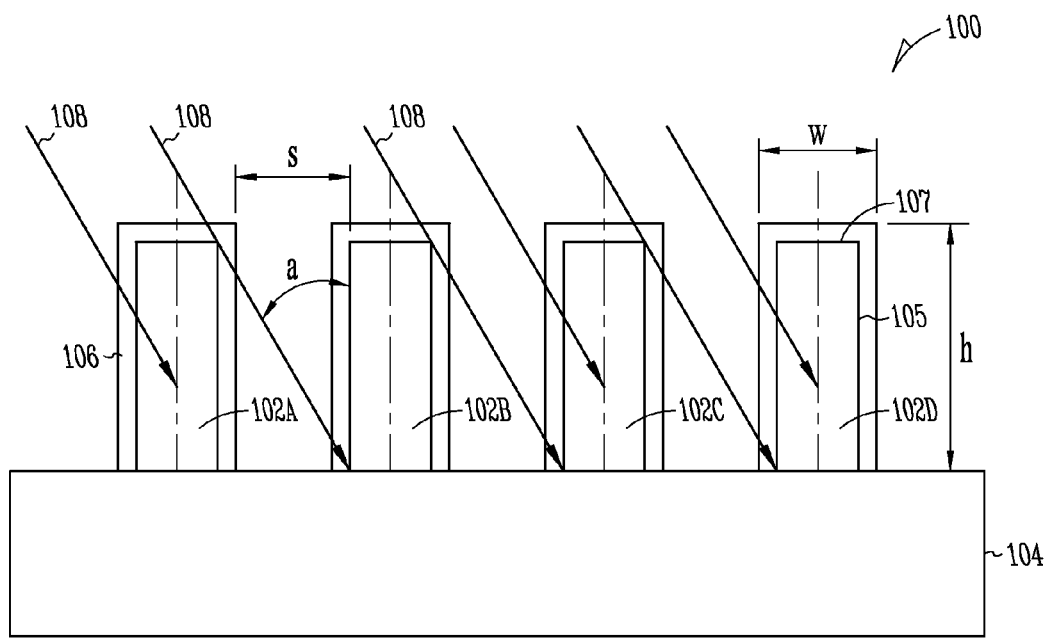

FIG. 1B is a cross-sectional view through the partially completed semiconductor wafer 100 shown in FIG. 1A showing an ion beam 108 enabling implantation of a dopant into silicon fins 102A-D according to some embodiment of the invention. In some embodiments, ion beam 108 is incident on silicon fins 102A-D at an implantation angle "a" to the vertical axis of silicon fins 102A-D. Implantation angle "a" is selected according to fin spacing "s" and height "h" and is determined by the equation $\tan(a)=s/h$.

In some embodiments, implantation could be either a dual mode or a quad mode operation. A dual-mode is an implant mode having two separate implantations performed on silicon fins 102A-D using ion beam 108. In this mode, semiconductor wafer 100 is first implanted with the dopant and then semiconductor wafer 100 is rotated by 180° about its vertical axis, following which another implantation is performed on the remaining channel area that was not implanted during the first implant. A quad-mode operation is an implant mode having four separate implantations performed on silicon fins 102A-D using ion beam 108. In embodiments according to this mode, semiconductor wafer 100 is first implanted with dopant and then semiconductor wafer 100 is rotated by 90° about its vertical axis followed by an implantation with the dopant. The implantation mode continues with two more rotations by increments of 90°, each followed by a further implantation. The above-described method of rotating semiconductor wafer 100 in a dual-mode or a quad-mode is used to ensure all channel-forming surfaces of silicon fins 102A-D are evenly implanted with the dopant.

In some embodiments, Fluorine is used as a dopant. In some embodiments, other dopant materials such as Boron difluoride (BF2), Boron trifluoride (BF3), Chlorine, Hydrogen, Deuterium, Nitrogen, Argon, Xenon, Neon and Krypton are used. In conventional methods Argon is implanted to the backside of the wafer using and implant dose of around 2E18 atoms/cm$^2$ and implant energy below 1 keV.

In some embodiments, the implant energy of the dopant directed on silicon fins 102A-D is distributed such that the peak concentration of impact distribution is on the center of the fins. In some embodiments, the implant dose would range from around 1E15 atoms/cm$^2$ to about 5E16 atoms/cm$^2$ and the implant energy would range from around 10 keV to about 60 keV. In some embodiments, while using the dopants to achieve flicker noise reduction, there is a starting threshold dose and a saturating dose of the dopant (e.g., Fluorine) beyond which no more improvement in flicker noise reduction is achievable.

In some embodiments, the implant dose applied on silicon fins 102A-D is selected to be lower than about 6E15 atoms/cm$^2$ and the implant energy is selected to be less than 20 keV. On the contrary, conventional methods use a higher implant energy and implant dose for fabrications having metal gates. Accordingly, in some embodiments, a higher implant energy and implant dose similar to that used in conventional methods can also be used for fabrications having metal gates.

Figure 1C:
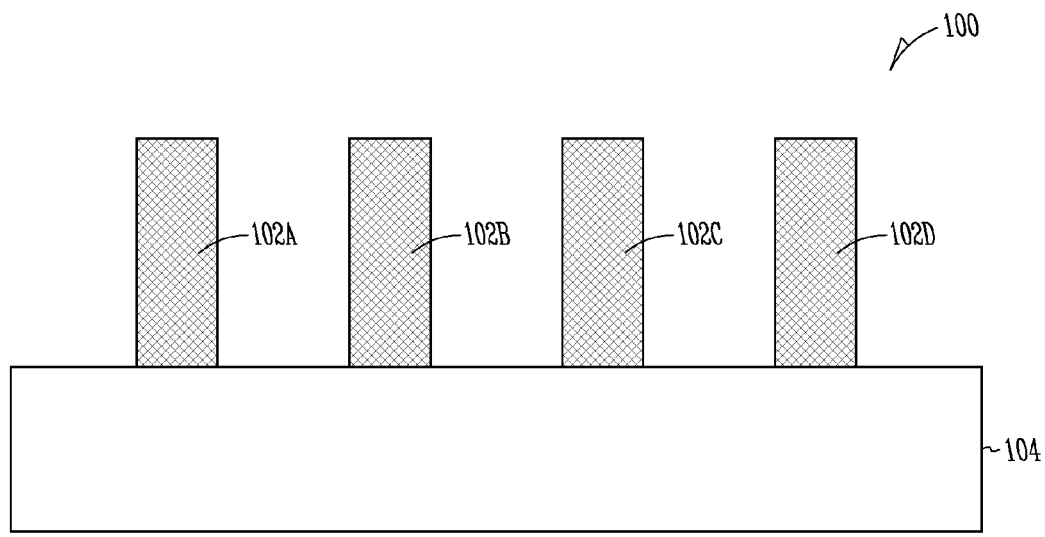

FIG. 1C illustrates a cross-sectional view through the partially fabricated semiconductor wafer 100 in FIG. 1B showing silicon fins 102A-D after the removal of screening oxide 106. In some embodiments, screening oxide 106 is removed in some embodiments by a process of wet etching using Hydrogen fluoride (HF) acid or dry etching using HF vapor. In some embodiments, a cleaning process is performed on silicon fins 102A-D using ammonia hydrogen peroxide water. Cleaning of silicon fins 102A-D using ammonia hydrogen peroxide water results in a decrease in flicker noise. Following the cleaning of silicon fins 102A-D, in some embodiments, an annealing process is performed to heal crystal damage in the fin from the implant. Additionally, in some embodiments, the thermal annealing process activates the dopant material within the silicon fins. If fluorine is used as dopant, there is no change in electrical conductivity. However, in the case where dopant materials used are implants such as B, P, and As some change in electrical conductivity will be realized as a result of the thermal annealing process. The anneal time and temperature depend on the desired characteristics of the semiconductor device being fabricated. In some embodiments, crystal damage annealing can be one of a rapid thermal anneal (RTA) or a laser anneal. In some embodiments, the anneal process has temperatures ranging from around 950° C. to about 1200° C. for a duration of about 1 to 60 seconds.

Following the crystal damage anneal performed above, a hydrogen ($H_2$) anneal is performed. This anneal provides smoothing of the corners and the rough sidewalls which are a result of etching the fin. This gives better electrical performance in terms of mobility and leakage current. For MOSFETs in general and especially for finFETs it has been shown that annealing in a $H_2$ ambient reduces flicker noise. In some embodiments the annealing temperature ranges from about 700° C. to 900° C. for about 1 to 10 minutes. In some embodiments, the process steps described above is also performed after the $H_2$ anneal if the implant dose of a dopant such as fluorine is low. In general, $H_2$ and fluorine compete with each other to quench gate insulator and interface traps. The lower binding energy of $H_2$ compared to fluorine leads to stronger increase of flicker noise under hot carrier stress.

Following the $H_2$ anneal performed above a wet HF dip followed by a cleaning using ammonia hydrogen peroxide water is used. After the cleaning step a further HF vapor clean can be applied to remove low-quality native oxide. Low-quality native oxide grows relatively quick and is a problem in achieving very thin high-quality gate oxides. In some embodiments, this cleaning is performed in the same chamber were the gate insulator oxidation is performed.

Figure 1D:
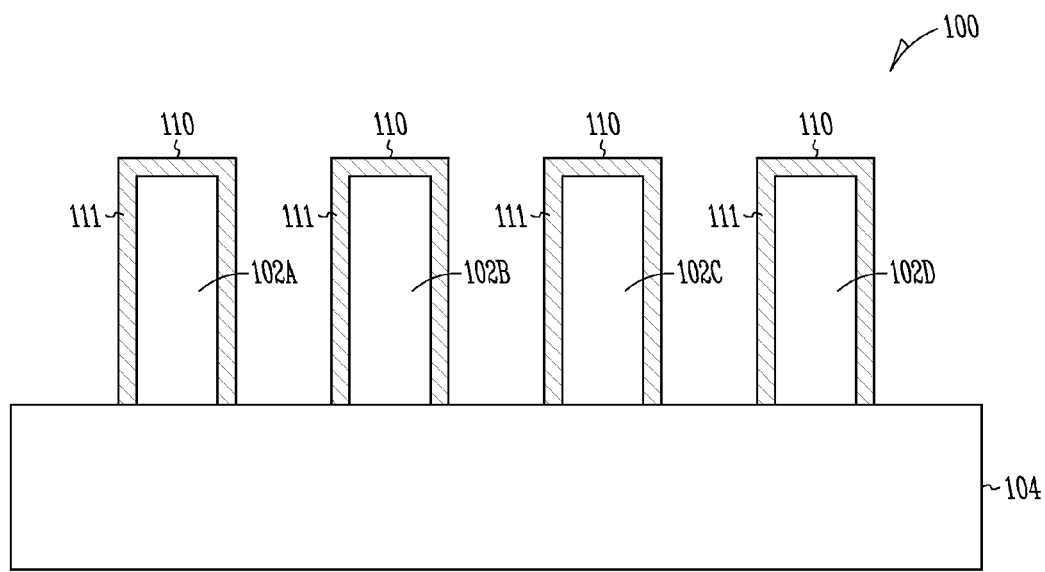

FIG. 1D illustrates a cross-sectional view through the partially fabricated semiconductor wafer 100 in FIG. 1C showing the growth of a gate insulator layer 110 after the thermal annealing process performed above. Following this a final post oxidation anneal is performed to distribute the dopant to the gate insulator silicon interface and into the gate insulator to quench interface and gate insulator traps. In some embodiments, post-oxidation anneal by itself already leads to reduced flicker noise for gate insulators grown at lower temperatures as it is the case for thin oxides of newer technologies due to the release of mechanical stress between the fin and the gate insulator. Typically, post oxidation anneal is performed in the temperature range from about 950 C to about 1200 C for a time period between about 1 second to about 20 seconds. In some embodiments, the gate insulator includes at least one of an oxide, a nitride, nitrided silicon oxide and hafnium oxide or any dielectric with high dielectric constant (k). In some embodiments, the gate insulator thickness ranges from about 15 nm down to about 0.5 nm. Smaller thicknesses could lead to higher gate leakage currents and larger thicknesses could require gate voltages above 5 V. Neither of these scenarios are desirable and hence not used in battery-driven systems.

In some embodiments, the generation of gate insulator layer 110 can provide the anneal temperature for diffusion of the fluorine. The diffusion of fluorine flows from the silicon fins 102A-D to the gate insulator-fin interface 111 and into the gate insulator layer 110. In some embodiments, this gate insulator layer 110 generation process is followed by a further post oxidation anneal. In some embodiments, this anneal is the source or drain junction anneal. That anneal provides the full diffusion of the fluorine as described above, due to the high diffusivity of fluorine in single crystal silicon and also due to the strong attraction of fluorine by the dangling bonds of the gate-insulator-silicon-fin interface.

Figure 1E:
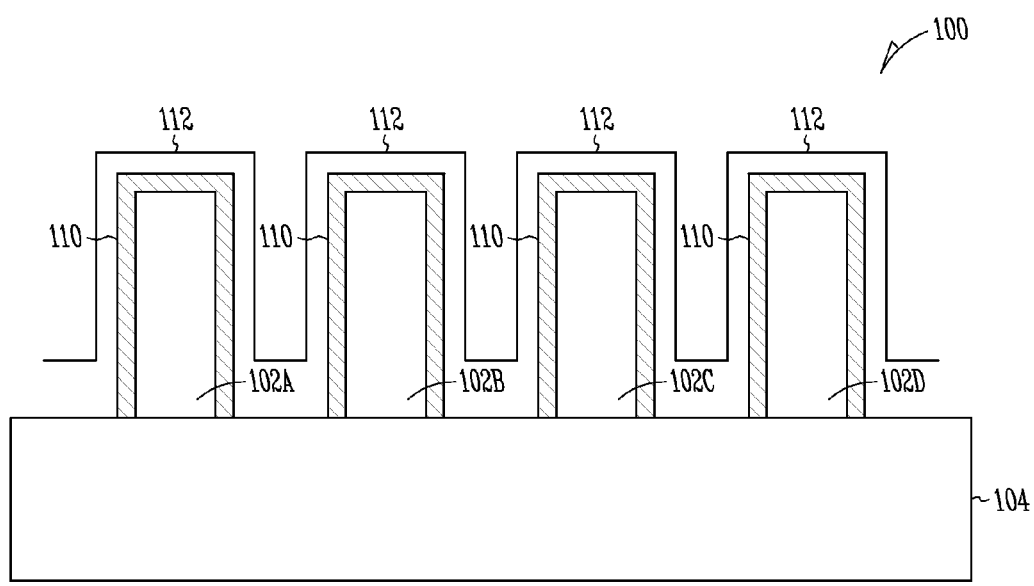

FIG. 1E illustrates a cross-sectional view through the partially fabricated semiconductor wafer 100 in FIG. 1D showing the inclusion of a gate stack 112 for a finFET or Multi-Gate transistor. In some embodiments, gate stack 112 may include at least one of a poly silicon gate, a fully silicided (FUSI) gate and a metal gate.

Figure 2:
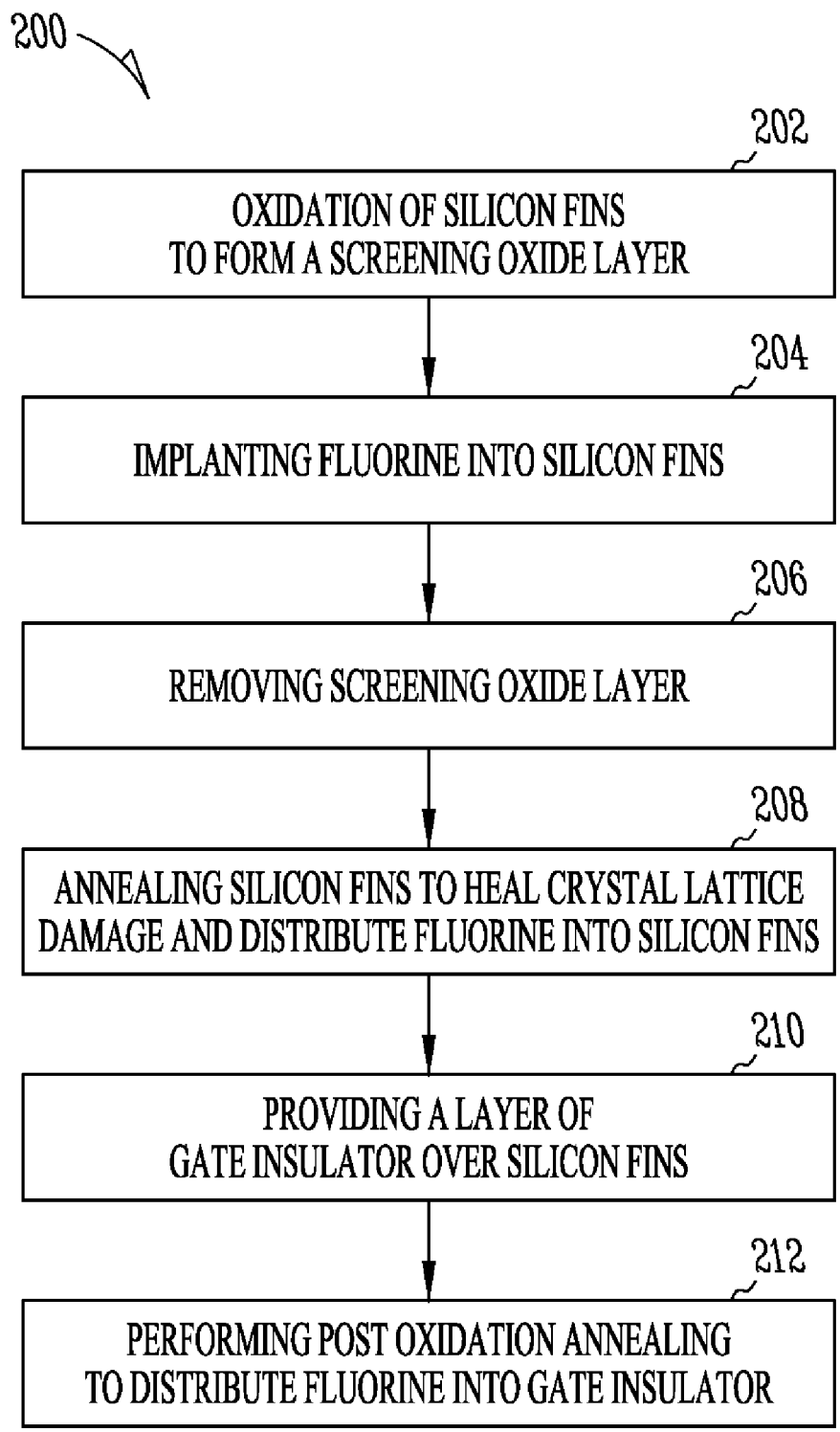
FIG. 2 is a flow chart showing some embodiments of a method of fabricating a FinFET.

FIG. 2 is a flow diagram 200 showing some embodiments of a method of fabricating a finFET. In 202, the method proceeds by performing oxidation of silicon fins 102A-D that are vertically disposed on substrate 104 is performed thereby generating a screening oxide layer 106. In 204, the method proceeds by implanting fluorine into silicon fins 102A-D. As described earlier, the implantation can be either of a dual mode (at 180°) or a quad mode (at 90°). Additionally, the capability of adjusting implantation angle "a" to achieve an optimum implant provides an added advantage over conventional methods such as plasma fluoridation of the gate insulator in finFETs or Multi-gate FETs where the option of adjusting the implantation angle "a" is not available.

In 206, the method proceeds by removing screening oxide layer 106 from silicon fins 102A-D. Removal of screening oxide layer 106 from silicon fins 102A-D may include the process of wet-etching using HF acid as well as cleaning using ammonia hydrogen peroxide water.

In 208, the method proceeds by annealing silicon fins 102A-D. Annealing of silicon fins 120A-D enables the healing of crystal lattice damage. In some embodiments, the healing of crystal lattice damage through annealing is followed by a $H_2$ anneal process. In some embodiments, the $H_2$ anneal process is followed by a wet HF dip. In some embodiments, the wet HF dip is followed by a cleaning using ammonia hydrogen peroxide water. In some embodiments, the method continues by performing a HF vapor cleaning in the same chamber were gate oxidation is performed.

In 210, the method proceeds by generating a gate insulator layer 110 over the silicon fins 102A-D. As described earlier, in some embodiments, following the formation of a gate insulator layer 110, a post oxidation anneal is provided in 212. In 212, the method proceeds by performing post-oxidation annealing of the semiconductor wafer 100 to distribute fluorine into gate insulator. In some embodiments, 212 is optional.

The above described method of implanting fluorine has several advantages over conventional methods of implanting dopants into gate stacks. In some embodiments, as described earlier other dopants such as Boron difluoride (BF2), Boron trifluoride (BF3), Chlorine, Hydrogen, Deuterium, Nitrogen, Argon, Xenon, Neon, or Krypton may be used. The method described in flow diagram FIG. 2 reduces the flicker noise of the device being fabricated. Flicker noise is a design constraint that limits complimentary metal oxide semiconductor (CMOS) RF and analog circuit performance with respect to signal-to-noise ratio in low-noise amplifiers (LNA), noise contribution of direct down conversion mixers and phase noise of voltage-controlled oscillators (VCO).

In some embodiments, metal gates provide low diffusivity towards dopants such as fluorine and consequently implantation of fluorine into gate insulators is prohibited using conventional methods. The method described in flow diagram FIG. 2 allows semiconductor wafers having metal gates to be implanted with dopants. In some embodiments, the material of metal gate includes at least one of Titanium Nitride (TiN) and Tantalum Nitride (TaN). The advantage of embodiments of the method described herein is that it can be used in semiconductor devices irrespective of the gate stack material since the implantation is performed before the gate stack is formed during the fabrication process.

Additionally, embodiments of the method disclosed above alleviates the problem arising from implantation of fluorine in the drain and source regions due to the reduced implant dose and energy required for the described process compared to conventional methods. Implantation of fluorine in the drain and source regions with a high dose after gate insulator growth and prior to the source/drain anneal step has the disadvantage of increasing junction capacitance (in bulk CMOS) and increasing dramatically junction leakage current. Moreover, embodiments of the disclosed method avoid creation of increased diffusion capacitance that reduces the RF figure of merit maximum oscillation frequency (fmax). Furthermore, embodiments of the disclosed method prevent high junction leakage that increases standby power consumption which is an important drawback for battery-driven systems.

Conventional methods of implanting fluorine in polysilicon gates of PMOS transistors exhibit strong co-diffusion of boron from the boron-doped poly silicon gate through the gate oxide into the n-well of a bulk CMOS device. Due to this boron diffusion an unwanted reduction of threshold voltage occurs. However, implanting of fluorine into buried oxide of a silicon-on-insulator (SOI) wafer could avoid some of the disadvantages of implanting it into the gate stack. Such an approach is inefficient because fluorine gets incorporated at the silicon oxide interface ("fluorine pile-up" in secondary-ion mass spectrometry (SIMS) profiling) of two interfaces exist above and below the buried oxide. Consequently, a high dose and high energy implant of the dopant is needed while using embodiments of the present methods. Furthermore, plasma fluoridation is difficult to apply to finFETs and Multi-gate FETs due to the vertical structure of the fins. Embodiments of the method described herein avoid some difficulties encountered with conventional methods, as described above.

Furthermore, embodiments of the method described in FIG. 2 can be applied to semiconductor wafers utilizing hafnium oxide. In some embodiments, the hafnium oxide contains various compositions of hafnium, silicon, oxygen and nitrogen.

Figure 3:
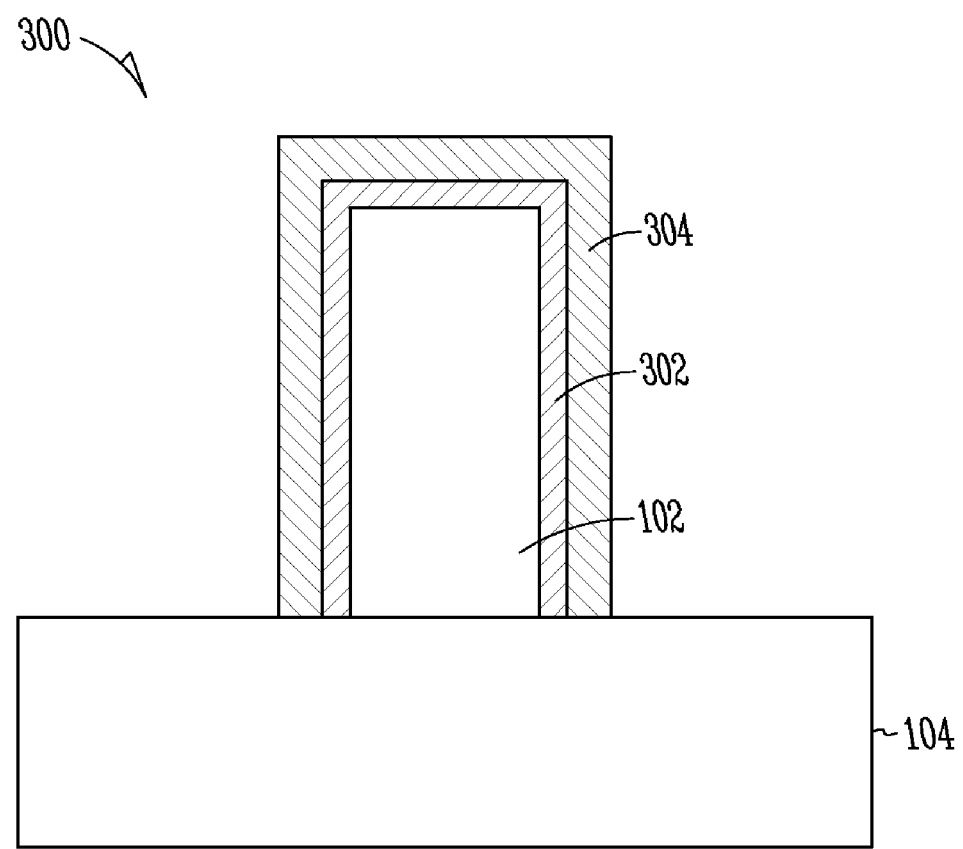
FIG. 3 illustrates a cross-sectional drawing of a partially completed semiconductor wafer showing some embodiment of a method of fabrication of a semiconductor device using a high-k material such as hafnium oxide and having a dopant implanted into fins.

FIG. 3 illustrates a cross-sectional drawing of the partially completed semiconductor wafer 100 showing some embodiments of a method of fabrication of a semiconductor device having a material with a high dielectric constant (a "high-k dielectric" material) and having a dopant implanted into the fins. The order of layers formed start from fin 102. Fin 102 is followed by a support layer 302. Support layer 302 contains almost none or very low concentration of hafnium. In some embodiments, support layer 302 is formed using silicon oxide. In some embodiments, support layer 302 is formed using nitrided silicon oxide. Support layer 302 is followed by a high-k dielectric material layer 304 as shown in FIG. 3. In some embodiments, layer 304 comprises a material having a high-k material. Examples of such high-k materials include selected oxides and silicates of zirconium (Zr) and hafnium (Hf). Other suitable high-k materials for layer 304 may also include, for example, $Al_2O_3$, $Gd_2O_3$, $Yb_2O_3$, $Dy_2O_3$, $Nb_2O_5$, $Y_2O_3$, $La_2O_3$, $TiO_2$, $Ta_2O_5$, $SrTiO_3$, $Ba_xSr_{1-x}TiO_3$, $Zr_xSi_{1-x}O_y$, $Hf_xSi_{1-x}O_y$, and $Al_xZr_{1-x}O_2$, as well as other compounds. In some embodiments, layer 304 comprises a material such as a hafnium-enriched silicon oxide or nitrided silicon oxide. In such embodiments, the hafnium concentration at the interface between the gate insulating layer and fin interface is low. In some embodiments, the gate insulator stack is generated using one of two process sequences namely (1) pre-oxidation process and (2) post-oxidation process of hafnium-free silicon oxide interface layer or hafnium-free nitrided silicon oxide interface layer.

The pre-oxidation process mentioned above involves the formation of silicon oxide interface layer by using thermal oxidation. In some embodiments, the silicon oxide interface layer may be nitrided. Use of nitrided silicon oxide can lead to higher flicker noise compared to pure silicon oxide depending on the nitridation process. Consequently, in some embodiments, plasma nitridation is performed. In some embodiments, post oxidation of thermal nitrided silicon oxide is performed. Following which, a hafnium-containing silicon gate oxide layer is formed. This is performed in low temperature using a metal-organic vapor deposition (MOCVD) technique and the diffusion of fluorine into the hafnium-containing portion of the gate insulator is avoided and as a result the wastage of fluorine in the fin is avoided.

The post-oxidation process mentioned above involves the sequence of generating a hafnium containing portion of the gate insulator followed by a hafnium-free silicon oxide (or nitrided silicon oxide) interface layer that is generated by thermal oxidation. In some embodiments, the nearly hafnium free oxide interface layer is between about 0.1 nm and about 1.0 nm thick. In some embodiments, the nearly hafnium free oxide interface layer has a thickness between about 0.1 nm and about half the thickness of the gate insulator.

The method of incorporating fluorine into the silicon oxide interfacial layer is not limited to embodiments having a hafnium-containing gate stack but can also be applied to embodiments having any kind of gate insulator with a high dielectric constant (k) having a silicon or nitrided silicon oxide interface layer present.

It should be noted that the methods described herein do not have to be executed in the order described, or in any particular order, unless it is otherwise specified that a particular order is required. Moreover, unless otherwise specified, various activities described with respect to the methods identified herein can be executed in repetitive, simultaneous, serial, or parallel fashion.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description. In the previous discussion and in the claims, the terms "including" and "comprising" are used in an open-ended fashion, and thus should be interpreted to mean "including, but not limited to . . . ".

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method of fabricating an integrated circuit, comprising:
    providing a semiconductor wafer including a fin;
    introducing a noise-reducing dopant into a sidewall of the fin;
    providing a gate insulator over the sidewall; and
    distributing at least a portion of the noise reducing dopant from the fin into the gate insulator.

2. The method of claim 1, including screening the fin with a screen layer before introducing the noise-reducing dopant.

3. The method of claim 2, wherein screening the fin includes oxidizing the semiconductor wafer to form the screen layer on the fin.

4. The method of claim 2, including removing the screen layer from the fin.

5. The method of claim 4, wherein removing the screen layer from the fin includes removing the screen layer with Hydrogen fluoride (HF) vapor.

6. The method of claim 4, wherein removing the screen layer from the fin includes wet etching the fin to remove the screen layer.

7. The method of claim 6, wherein the wet etching includes wet etching the fin using an etching agent including HF acid.

8. The method of claim 4, further comprises cleaning the fin using a cleaning agent including ammonia hydrogen peroxide water.

9. The method of claim 1, wherein distributing at least a portion of the noise-reducing dopant includes annealing the semiconductor wafer.

10. The method of claim 9, wherein annealing the semiconductor wafer includes maintaining the semiconductor wafer at a temperature between about 950° C. and about 1200° C. for a time period between about 1 second and about 60 seconds.

11. The method of claim 9, wherein annealing the semiconductor wafer further comprises a post-oxidation annealing to allow distribution of the dopant into the gate insulator.

12. The method of claim 11, wherein the post-oxidation annealing includes maintaining the wafer at a temperature between about 950° C. and about 1200° C. for a time period between about 1 second and about 20 seconds.

13. The method of claim 1, wherein introducing a noise-reducing dopant into a sidewall of a the fin includes introducing into the sidewall at least one of the group of materials consisting of Fluorine, Boron difluoride, Boron trifluoride, Chlorine, Hydrogen, Deuterium, Nitrogen, Argon, Xenon, Neon and Krypton.

14. The method of claim 13, wherein introducing a noise-reducing dopant into a sidewall of the fin includes implanting the noise-reducing dopant into the sidewall of the fin.

15. The method of claim 14, wherein implanting includes implanting the noise-reducing dopant into the sidewall of the fin at an implantation angle.

16. The method of claim 15, wherein an implantation angle, a, is determined by solving the equation:

$$\tan(a)=s/h$$

where, "s" is the spacing between two consequent fins, and "h" is the height of the silicon fins.

17. The method of claim 14, wherein implanting the noise-reducing dopant on the fin is performed in a dual mode.

18. The method of claim 14, wherein implanting the noise-reducing dopant on the fin is performed in a quad mode.

19. The method of claim 1, including providing a gate stack over the gate insulator.

20. The method of claim 1, wherein the gate insulator includes at least one of an oxide, a nitride, nitrided silicon oxide and a high-k dielectric material.

21. The method of claim 19, wherein the gate stack includes at least one of a poly silicon gate, a fully silicided gate and a metal gate.

22. The method of claim 1, wherein the introducing a noise-reducing dopant includes introducing Fluorine into the sidewall of the fin.

23. A method of fabricating an integrated circuit, comprising:
    providing a substrate including a fin;
    introducing at least one of Fluorine or Chlorine into a sidewall of the fin
    generating a gate insulator over the sidewall; and
    distributing at least a portion of the at least one of the Fluorine or the Chlorine into the gate insulator.

24. The method of claim 23, including:
    providing a gate stack over the gate insulator.

25. The method of claim 23, wherein introducing the noise-reducing dopant includes implanting the noise-reducing into the sidewall of the fin.

26. The method of claim 23, including:
    screening the fin with a screen layer before introducing the noise-reducing dopant into the sidewall of the fin; and
    removing the screen layer from the fin after introducing the noise-reducing dopant into the sidewall of the fin.

27. The method of claim 23, wherein the introducing includes introducing Fluorine into the sidewall of the fin.

28. The method of claim 23, wherein the distributing the at least a portion of the at least one of the Fluorine or the Chlorine includes annealing the substrate.

* * * * *